United States Patent [19]  
Sutterlin et al.

[11] Patent Number: 5,463,662  
[45] Date of Patent: Oct. 31, 1995

[54] APPARATUS AND METHOD FOR REDUCING ERRORS IN DATA CAUSED BY NOISE THROUGH USE OF BLANKING

[75] Inventors: Philip H. Sutterlin, San Jose; Walter J. Downey, Los Gatos; Benjamin W. Chui, Sunnyvale; J. Marcus Stewart, San Jose; Amy O. Hurlbut, San Francisco, all of Calif.

[73] Assignee: Echelon Corporation, Palo Alto, Calif.

[21] Appl. No.: 225,247

[22] Filed: Apr. 8, 1994

[51] Int. Cl.⁶ .................................................. H04B 1/10
[52] U.S. Cl. ........................................ 375/351; 455/223
[58] Field of Search ........................... 375/58, 104, 285, 375/351; 455/223, 3.3; 340/310.01; 327/100, 101

[56] References Cited

U.S. PATENT DOCUMENTS

| | | | |
|---|---|---|---|
| 4,070,631 | 1/1978 | Nash et al. | 375/104 |
| 4,124,819 | 11/1978 | Hansen | 455/223 |
| 4,236,254 | 11/1980 | Augustin et al. | 455/223 |
| 4,755,792 | 7/1988 | Pezzolo et al. | 340/310.03 |
| 4,918,690 | 4/1990 | Markkula, Jr. et al. | 370/94.1 |
| 5,195,098 | 3/1993 | Johnson et al. | 371/6 |
| 5,210,518 | 5/1993 | Graham et al. | 340/310.02 |
| 5,260,974 | 11/1993 | Johnson et al. | 375/76 |
| 5,271,038 | 12/1993 | Cai | 375/104 |

OTHER PUBLICATIONS

*IEEE Transactions on Communications*, Jan. 1976, pp. 106–112. "A Class of Soft Decision Error Detectors for the Gaussian Channel".

"Errors-and-Erasures Coding to Combat Impulse Noise on Digital Subscriber Loops", IEEE Transactions on Communication, vol. 38, No. 8, Aug. 1990.

*Primary Examiner*—Stephen Chin  
*Assistant Examiner*—Jeffrey W. Gluck  
*Attorney, Agent, or Firm*—Blakely, Sokoloff, Taylor & Zafman

[57] ABSTRACT

An apparatus for snubbing or blanking digital signals representing a band of signals that includes an encoded carrier signal transmitted over a power line. An average signal level is compared with the instantaneous signal level to develop a blanking circuit control signal. Additionally, snubbing occurs in the circuit which determines the average signal level to prevent noise from building-up the average signal level. A hold-off signal is used in this circuit to prevent the average signal level from being latched permanently low. A unique infinite impulse filter subtracts out the D.C. offset thereby improving the dynamic range of the blanking. Additionally, the average signal level is used by AGC logic to control the gain at the front end of the apparatus. The state and switching of the AGC is controlled to minimize errors.

20 Claims, 10 Drawing Sheets

HIGH PASS IIR

AGC STATE DIAGRAM

APPARATUS AND METHOD FOR REDUCING ERRORS IN DATA CAUSED BY NOISE THROUGH USE OF BLANKING

BACKGROUND OF THE INVENTION

1. Field of the Invention

The invention relates to the field of power line communications, more particularly, to transceivers enabling such communications.

2. Prior Art

U.S. Pat. No. 4,918,690 describes a system for providing sensing, bidirectional communications, and control. Communications between a plurality of cells enables, for example, control for switching and the like. The present invention provides a transceiver for power line communications which may be used with the system described in U.S. Pat. No. 4,918,690.

A major problem with power line communications is background noise including impulse noise. This noise originates not only from the power source and distribution network, but also from the loads. The noise is not constant with respect to time, and moreover, it varies from place-to-place in a power distribution network. A theoretical analysis of impulse noise, particularly for twisted pair cabling, is described in "Errors-and-Erasures Coding to Combat Impulse Noise on Digital Subscriber Loops", IEEE Transactions on Communications, Vol. 38 No. 8, August, 1990, beginning at page 1145.

The present invention, as will be seen, employs snubbing or blanking to eradicate noise impulses. Snubbing or blanking has been used in connection with radio receivers, and such use is described in U.S. Pat. No. 4,124,819. Moreover, this technique has been used in power line communications as described in U.S. Pat. No. 5,210,518.

SUMMARY OF THE INVENTION

The present invention is used in a communications apparatus for communicating packets of information over a power distribution line where the information is carried by a carrier signal having a frequency substantially higher than the fundamental frequency used to deliver power. After power distribution frequencies have been filtered out, the signal from the power line is sampled by an analog-to-digital converter to provide digital signals representative of the samples. The sampling occurs at a frequency higher than the carrier frequency. A first circuit determines the low-frequency offset for the digital signals. This offset is removed in a subtractor. A second circuit determines an average signal level for the digital signal; this average signal level is compared to the instantaneous level of the digital signal to provide a control signal when the instantaneous signal level exceeds the average signal level by some predetermined amount. A blanking circuit then blanks the digital signal under control of the control signal. Other aspects of the present invention include permitting the average signal level to rise more quickly than it decays, freezing the average signal level to prevent noise pulses from raising the average level, and gradual turning on of the digital signal following snubbing.

The power line communications apparatus in which the improved blanking circuit is used includes an automatic gain control (AGC) circuit. As will be seen, this gain control circuit is used in conjunction with the improved blanking circuit. As will be described, gain changes are controlled so as to prevent data recovery errors that could be caused either by switching too frequently in response to noise or by responding too slowly when a low amplitude message follows a message of much higher amplitude.

Thus, the present invention provides an algorithm for switching the gain which reduces errors due to gain changes and reduces missed packets due to the AGC being in the wrong state.

BRIEF DESCRIPTION OF THE DRAWINGS

FIG. 9 illustrates waveforms used to describe the operation of the blanker with soft turn-on.

DETAILED DESCRIPTION OF THE PRESENT INVENTION

A power line communications (PLC) apparatus is described which enables communications over power lines between cells or other devices. The apparatus may be realized either with discrete components or as an integrated circuit formed on a single substrate employing well-known complementary metal-oxide-semiconductor (CMOS)technology or other semiconductor processing technologies.

In the following description numerous specific details are set forth such as specific frequencies. These details are provided to enable one to fully appreciate and understand the present invention. It will be obvious to one skilled in the art that the present invention may be practiced without these specific details. In other instances, well-known circuits are shown in block diagram form in order not to unnecessarily obscure the present invention in detail.

The currently preferred embodiment of the PLC transceiver in which the present invention is used is realized as an integrated circuit where binary phase shifting encodes digital information at a rate of 5.4 k bits per second on a carrier of approximately 131.6 kHz. After initial filtering and gain control, the signal for the receiver is sampled at a 10 MHz rate and converted into a digital sequence. Consequently, much of the discussion below involves the digital processing of these samples in the receiver and their snubbing or blanking in the digital domain. Other aspects of the PLC "chip" that includes the present invention are described in "Method and Apparatus for Robust Communications Based upon Angular Module" Ser. No. 224,820, filed Apr.

18, 1994; "Apparatus and Method for Detecting a Signal in a Communications System" Ser. No. 224,903, filed Apr. 8, 1994; and "Sigma-Delta Converter Having a Digital Logic Gate Core" Ser. No. 205,704, filed Mar. 3, 1994. All of the above applications are assigned to the Assignee of the present application.

OVERVIEW OF PRESENT INVENTION

Figure 1:
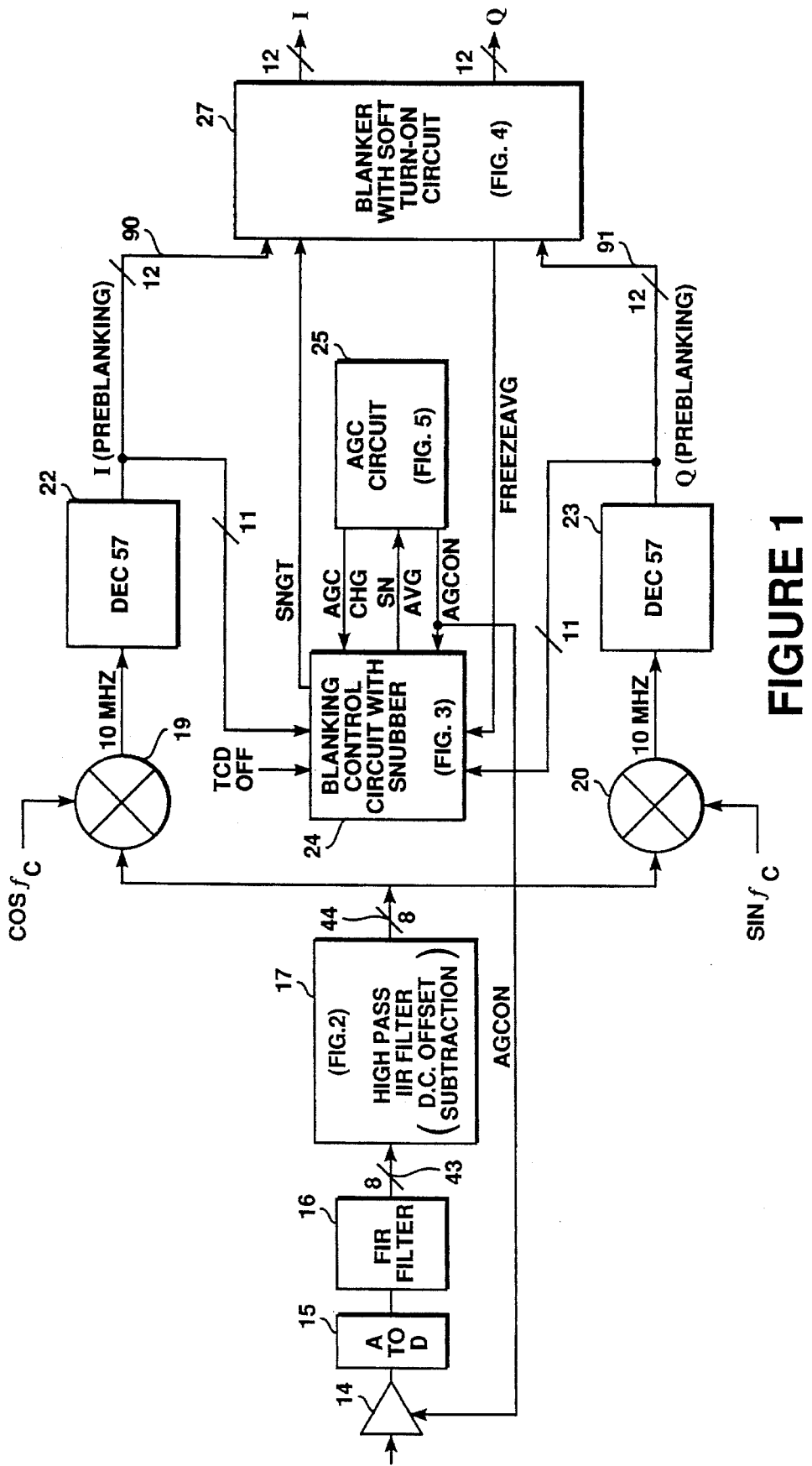
FIG. 1 is a block diagram of a portion of a power line communications apparatus which includes a digital high pass filter, blanking control, circuit with snubber, blanker with soft turn-on, and automatic gain control circuit used with the present invention.

The present invention is used in a power line communications (PLC) receiver which is part of a PLC transceiver. Referring to FIG. 1, the power line is coupled to the input of amplifier 14 for receiving the information-carrying signals from the power line. Filtering not shown may be used to filter out frequencies substantially above or below the carrier frequency. The amplifier 14 in the currently preferred embodiment provides either unity gain or 18 dB gain depending on the state of the AGCON signal. This signal is generated by the automatic gain control (AGC) circuit 25 of FIG. 1 (shown in detail in FIG. 5). The output of amplifier 14 is sampled and converted to a digital sequence by the analog-to-digital converter 15. This converter is described in detail in one of the co-pending applications mentioned above. The output of converter 15 is coupled to a finite impulse response filter 16 to filter out the higher frequencies from the sigma-delta converter used for the analog-to-digital conversion. The 8-bit digital signals (in two's complement format) from this filter are coupled to a high pass infinite impulse response (IIR) filter 17. This filter is shown in detail in FIG. 2. Any DC offset, particularly associated with the analog-to-digital converter 15, is subtracted from the digital signals within this filter. Subtracting this offset is important since it increases the dynamic range of the calculated average signal level which is used in the blanking control circuit to detect noise pulses.

The output of filter 17 is coupled to two multiplier circuits 19 and 20 and multiplied by single-bit-limited cosine and sine waves at the carrier frequency, respectively. This provides the in-phase (I) and quadrature phase (Q) signals used for recovering the information encoded onto the carder. The decimator circuits 22 and 23, in effect, divide the sampling rate of the input digital signal by 57, while increasing its resolution. The output of the decimator circuits 22 and 23 are coupled into the blanking control circuit 24 and to the blanking with soft turn-on circuit 27. Circuit 24, which is shown in detail in FIG. 3, combines the digital information on the I and Q channels and determines an average signal level for these signals. This average level is compared to the instantaneous signal level of the combined I and Q signals, and when the instantaneous level exceeds the average level by a predetermined amount, a control signal (SNGT "snubber greater-than") is asserted. This control signal is coupled to circuit 27. Other inputs and outputs of blanking control circuit 24 include the carrier detect off signal which indicates that the transceiver is currently transmitting (TCDOFF), automatic gain control change signal (AGCCHG) and the snub average signal (SNAVG). The average signal is maintained constant, that is, frozen, under the control of the FREEZEAVG signal supplied by blanker circuit 27 under certain conditions as will be described.

In the prior art, the terms snubbing or blanking are often used interchangeably. In the currently preferred embodiment of the present invention, snubbing or blanking is used twice, once in the main signal path and secondly, in the circuit used for providing the average signal level. In order to prevent confusion, the term "blanking" is used when discussing the noise/pulse suppression occurring in the main signal path (blanking with soft turn-on circuit 27) and the term "snubbing" is used when referring to the noise/pulse suppression occurring within the blanking control circuit with snubber 24. Note, however the blanking control signal is referred to as SNGT (snub greater-than).

Figure 5:
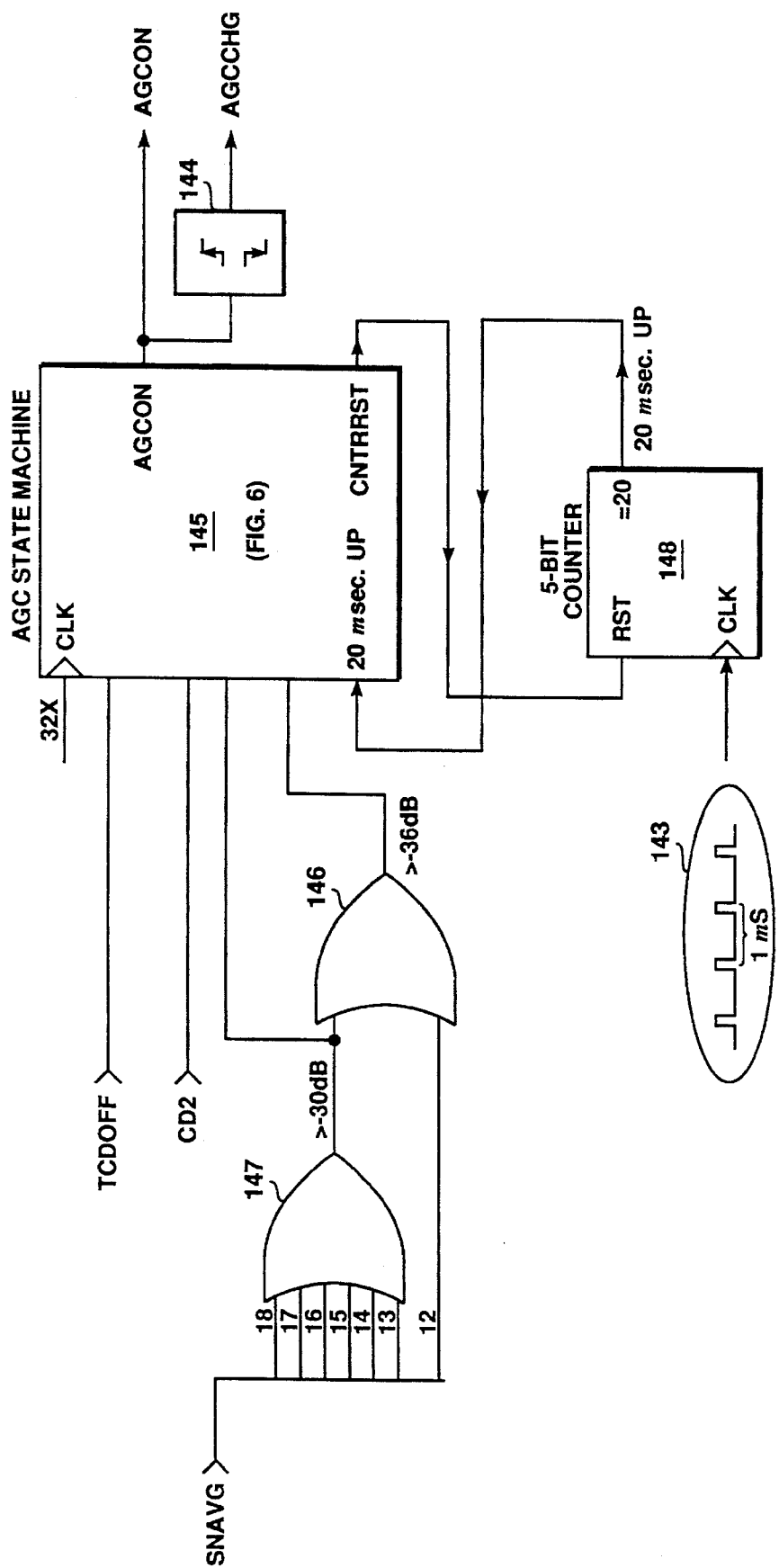
FIG. 5 is a block diagram of the AGC control logic.

The AGC circuit 25 which is shown in FIG. 5 provides the AGCCHG signal and AGCON signal to circuit 24. It uses the SNAVG signal from circuit 24.

HIGH PASS IIR FILTER

To maximize blanking sensitivity it is necessary to remove any DC offset from the input signal since a DC component would erroneously raise the measured average signal level used for determining when blanking should occur. For the receiver architecture of FIG. 1, any residual DC offset at the input to multipliers 19 and 20 results in carrier frequency energy at the multiplier outputs. Subsequent measurement of average signal level would thus include both the desired received signal level and the level of the internally generated signal which results from the receiver's DC offset. Removing the DC offset is particularly important for detection of noise pulses which are small in amplitude compared to the magnitude of the offset (yet still large enough to cause data errors). Thus removing the DC component improves the dynamic range of noise pulse detection. In effect, the circuit of FIG. 2 provides digital AC coupling.

Figure 2:
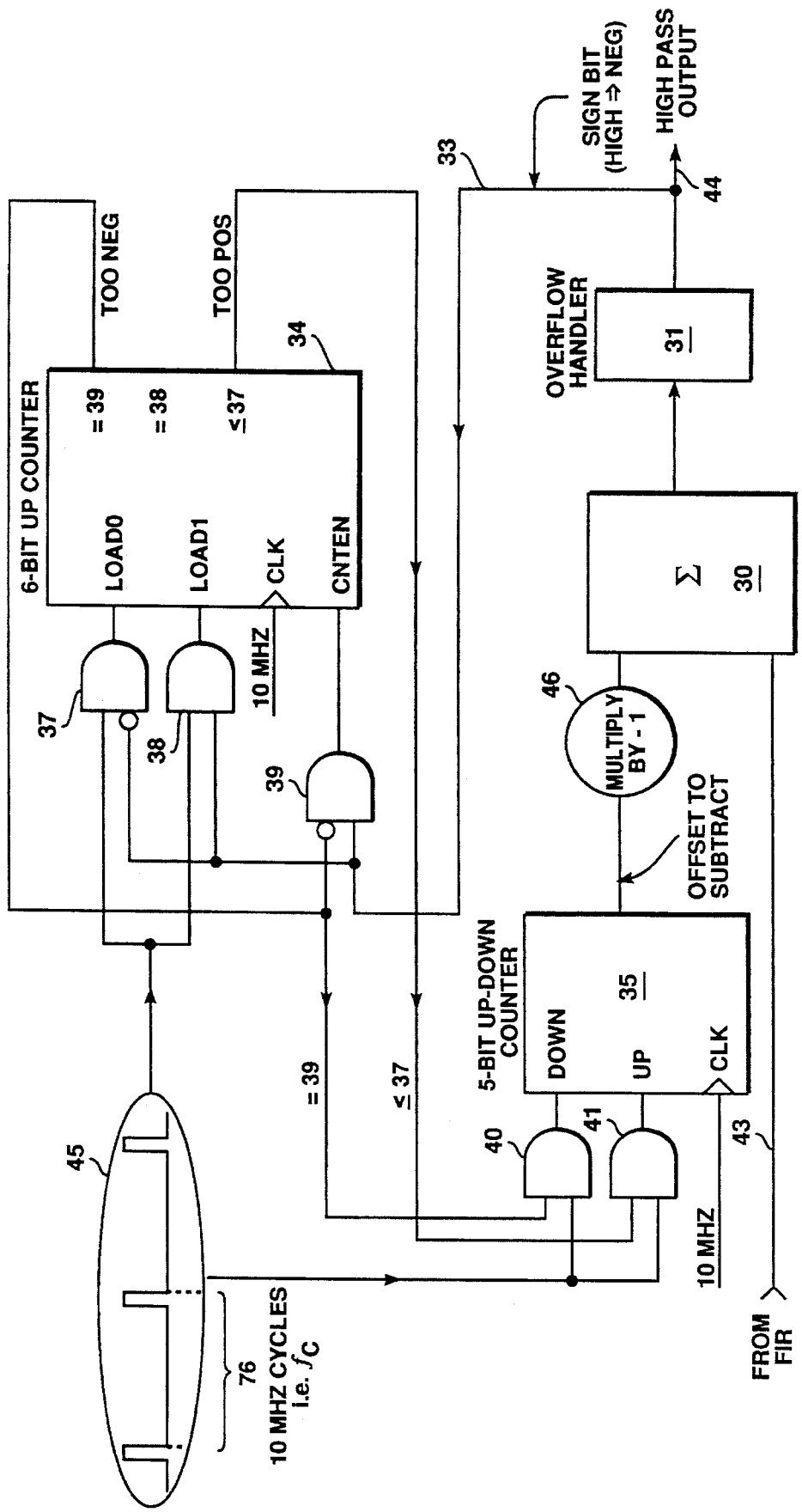
FIG. 2 is a detailed block diagram showing the digital" high pass filter of FIG. 1.
Figure 7:
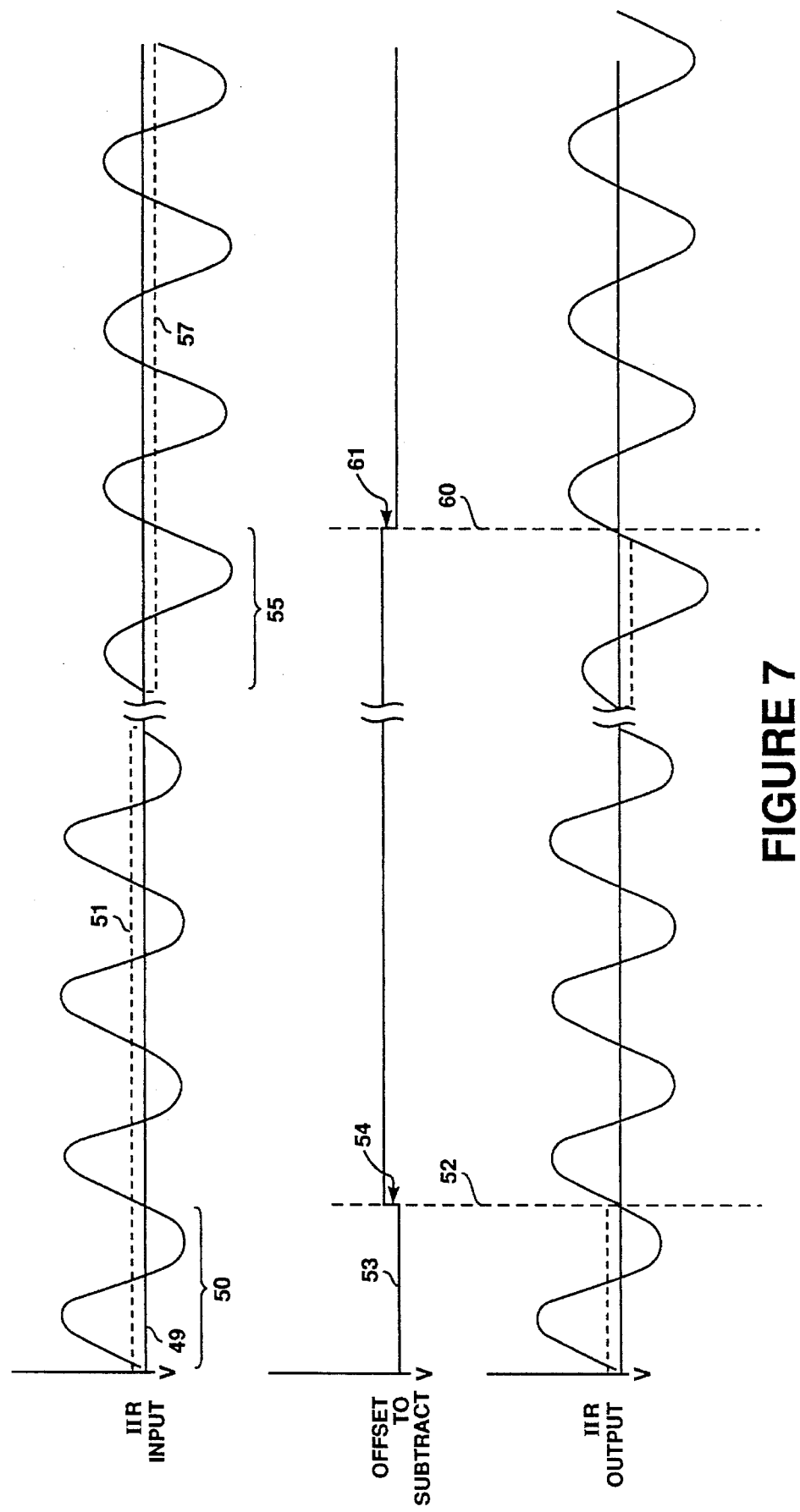
FIG. 7 illustrates waveforms used to describe the digital high pass filter of FIG. 2.

Before reviewing FIG. 2, it will be helpful to understand the general manner in which the circuit of FIG. 2 operates, as shown in FIG. 7. The input signal to the filter is shown on line 49 in analog form for purposes of explanation rather than the digital signals actually used. During a first period 50 it can be seen that the waveform is more positive than negative. The signal average is shown by the dotted line 51 which is above line 49. The circuit of FIG. 2 detects that during period 50 samples are too positive and subtracts a larger offset beginning at time 52. This larger offset is shown by the increase 54 in the waveform 53. As can be seen after the time 52, the output waveform is neither too positive nor too negative and for this condition, the offset remains unchanged.

During period 55 the waveform has drifted in the negative direction; its average is represented by the dotted line 57. After time 60 the offset is decreased as indicated by the decrease 61, and as shown after time 60 the output waveform is again neither too positive nor too negative.

As will be seen, the determination of whether the waveform is too negative or too positive is accomplished by, in effect, integrating the sign bit of each digital sample over a predetermined period. Based on the results of this integration, the estimate of the offset to be subtracted is either increased or decreased.

Referring now to FIG. 2, the input to the high pass IIR filter, line 43, is coupled to one input terminal of the summer 30. The summer 30 receives, as its second input, the output of multiplier 46 which multiplies its input by minus 1. Thus, summer 30 receives the input samples (in two's complement form) and subtracts from the samples an estimate of the offset determined by the circuitry coupled to multiplier 46. The output of summer 30 is coupled to an overflow handler 31 which prevents a wrap-around of the data from occurring. The output of the high pass filter is shown as line 44. The most significant bit (the sign bit) is coupled by line 33 to AND gate 39.

A 6-bit up counter 34 counts at the sampling rate of 10

MHz. This counter is enabled by the signal at the count enable (CNTEN) terminal. When CNTEN is high, the counter counts up; if this signal is low, the counter does not count. The most significant (sign) bit of the high pass filter output is coupled to the CNTEN terminal through the gate 39. As currently implemented, a high signal on line 33 indicates that the digital signal on line 44 is negative. The counter 34 initially is loaded with either decimal zero or decimal one. If the output of the gate 37 is high, zero is loaded into the counter. On the other hand, if the output of the gate 38 is high, the counter is loaded with a decimal one (000001). The counter is loaded once every 76 cycles of the 10 MHz clock, as shown by the waveform within the bubble 45. This waveform is coupled to one terminal of gates 37 and 38. The other terminal of gate 38 receives the signal on line 33 while the other terminal of gate 37 receives the complement of this signal. Every 76 cycles of the 10 MHz clock, when a pulse is applied to both gates 37 and 38, if the signal on line 33 is high, decimal one is loaded into the counter; on the other hand, if the signal on line 33 is low, decimal zero is loaded into the counter since the output of gate 37 will be high.

The counter 34 counts up at the 10 MHz rate each time there is a high output from gate 39. If the waveform represented by the samples is more negative than positive, the counter will count at least 39 counts (one half of 76+1). When a count of 39 is reached, an output signal from the counter (at the terminal shown as "=39") provides a signal to the inverting terminal of gate 39 thereby disabling additional counting. The counter stops counting until it is once again reset by the signal shown within the bubble 45. If the count only reached a count of 37 or less, this is an indication that the waveform represented by the past 76 samples is more positive than negative. In this event a high signal level is present at the terminal indicated as "≦37".

The "too positive" or "too negative" signals are used by counter 35 to increase or decrease the count in 5-bit counter 35. The count within counter 35 represents the estimated DC offset. The count within the counter 35 is increased or decreased, at most, once every 76 cycles of the 10 MHz clock, since this timing signal is applied to one of the terminals of gates 40 and 41. The other terminal of gate 40 receives the "too negative" signal while the other terminal of gate 41 receives the "too positive" signal. When the count is equal to 38 within counter 34, the count within counter 35 is not changed.

The circuit of FIG. 2 effectively integrates the most significant bit in the two's complement form of the digital samples representing the data-carrying waveform. Counter 34 (for 76 cycles of the 10 MHz clock) counts up for negative samples. If the result of this counting indicates that the waveform is too negative, counter 35 is decremented, or if the signal is found to be too positive, counter 35 is incremented. If the waveform is neither too positive nor too negative (with the count in counter 34 equal to 38) the count in counter 35 remains the same. The counter 35 includes logic that causes it to remain at its highest count once it reaches its highest count, even if an additional increment signal is applied. Additionally, counter 35 includes logic that prevents it from changing its count when it reaches its lowest count even if additional signal is received indicating that the counter should decrement.

Figure 10:
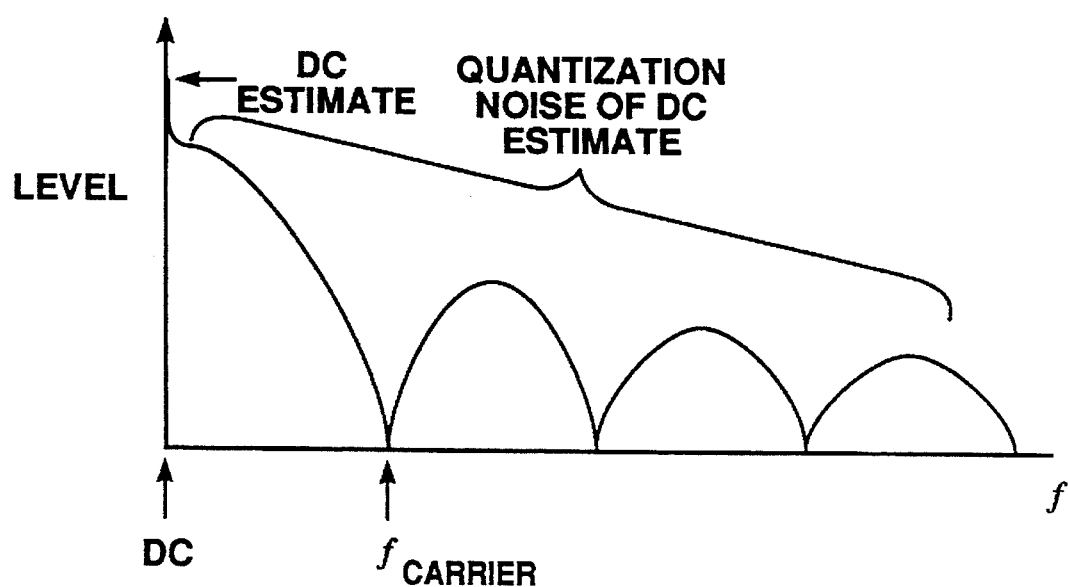
FIG. 10 is a graph illustrating the quantization noise distribution associated with the DC estimate.

In the currently preferred embodiment, the IIR high pass filter receives 8-bit samples and the DC offset estimate (up to 5 bits in magnitude) is subtracted from the 8 bits as discussed above. The update rate for the DC offset is equal to the carrier rate. This results in a null in the quantization noise spectrum of the subtracted DC estimate, as shown in FIG. 10. This feature is important in order to avoid degrading the dynamic range of the recovered signal.

The described IIR high pass filter is realized with fewer gates than is required for a more traditional IIR filter. Typically, where integration occurs in a feedback loop, the word width is quite large, requiring extensive logic for signal calculation, scaling, and storage. With the invented IIR filter only the sign bit is integrated and estimates are used to only increment or decrement the offset.

BLANKING CONTROL CIRCUIT WITH SNUBBER

Figure 3:
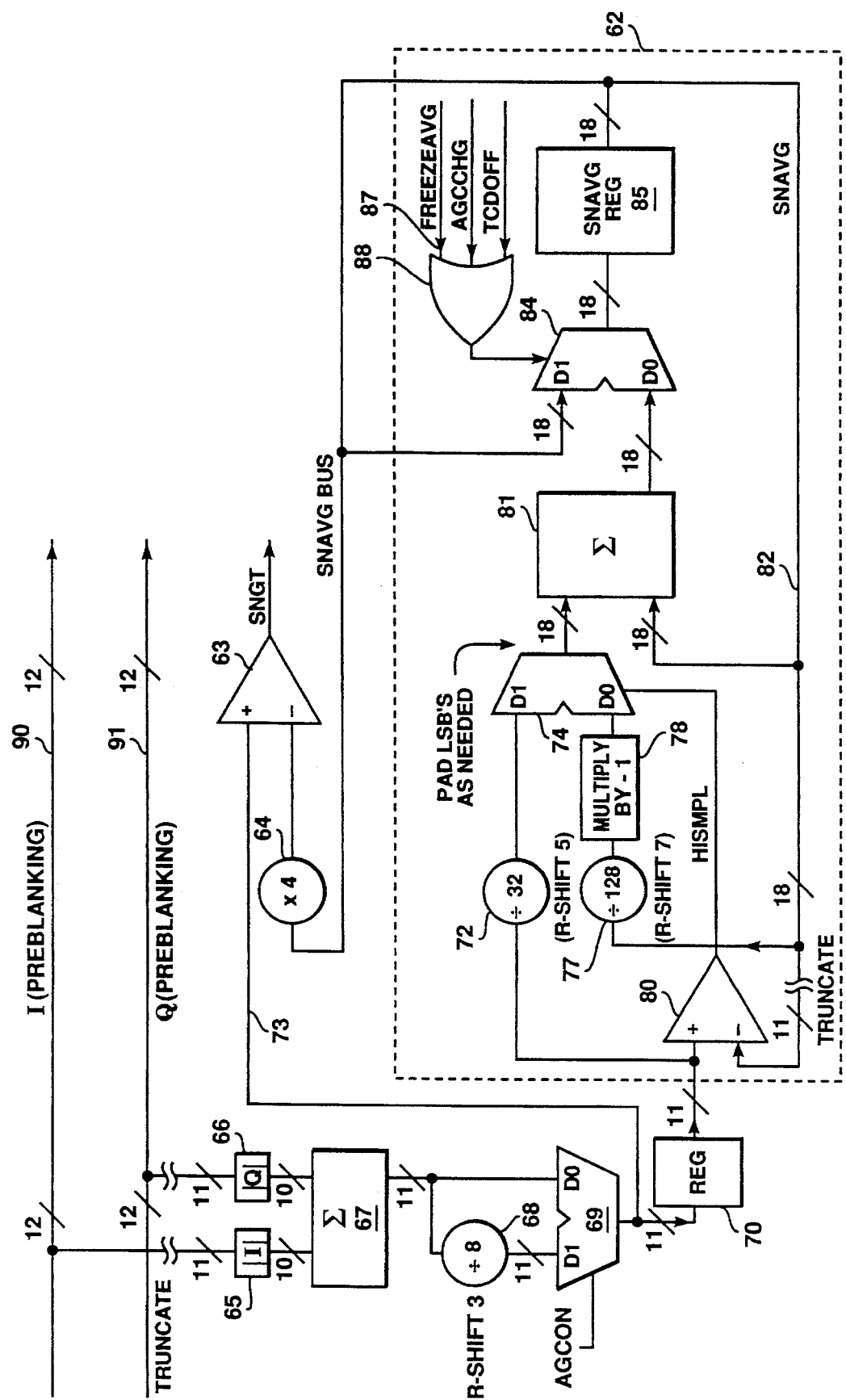
FIG. 3 is a detailed block diagram showing the blanking control circuit with snubber of FIG. 1.

In FIG. 3, the blanking control circuit with snubber shown as circuit 24 of FIG. 1 is shown in detail. In general, this circuit determines the average signal level (SNAVG) of the waveform represented by the digital sequence and compares this average level with the instantaneous value. The average level is determined by the circuit shown within the dotted line 62. This average level is communicated on SNAVG bus 82 to multiplier 64 and, after being multiplied by four by multiplier 64, the output is compared to the instantaneous value communicated to the positive terminal of comparator 63 on lines 73. Thus, when the instantaneous value at least is four times larger than the average level, comparator 63 asserts the SNGT signal to blanking circuit 27 of FIG. 1.

The blanking control circuit of FIG. 3 combines the signals on the I and Q channels for purposes of determining both the instantaneous signal value and the average level. The 12 bits at the output of decimator 22 in FIG. 1 are truncated to 11 bits and applied to circuit 65 in FIG. 3. Similarly, the 12 bits at the output of the decimator 23 in FIG. 1 are truncated to 11 bits and applied to circuit 66 in FIG. 3. Circuits 65 and 66 determine the absolute value of their respective truncated input signals and each provides a 10-bit output to summer 67. These signals are summed within summer 67. In effect, circuits 65, 66 and 67 approximate the root-means-squared (RMS) sum of the signals in the I and Q channels.

The 11-bit sum signal from summer 67 is coupled to one input terminal (D0) of multiplexer 69 and to the input terminal of a "÷8" circuit 68. This circuit simply shifts the data three bits to the right in the currently preferred embodiment. The output of the ÷8 circuit is coupled to the D1 terminal of multiplexer 69. Multiplexer 69 is controlled by the AGC-on signal (AGCON). When the AGCON signal is high, amplifier 14 of FIG. 1 provides 18 dB of gain. When this occurs, multiplexer 69 selects the ÷8 output from divider 68 and couples it to register 70 as well as to comparator 63. When the AGCON signal is low (unity gain in amplifier 14) the signal on the D0 terminal of multiplexer 69 is selected and is coupled to register 70 and comparator 63. The output of the multiplexer 69 is delayed by one clock count of the 175 kHz clock ( 10 MHz divided by 57) in register 70.

In the portion of the PLC apparatus which includes FIG. 3 (after decimators 22 and 23), samples occur at a 175 kHz rate or 32 times the 5.48 k symbol rate. Thus, the circuit of FIG. 3 including register 70 operates at a 175 kHz rate.

Referring now to the circuit within dotted line 62, register 85 stores the average signal level as an 18-bit word. This 18-bit word is communicated over bus 82 to summer 81 and divider 77, and the 11 most significant bits of this word are coupled to comparator 80. In comparator 80, the average level is compared to the instantaneous level (output of register 70). If the instantaneous level is higher, the high sample signal (HISMPL) causes multiplexer 74 to select terminal D1. Alternatively, if the average level is larger than the instantaneous level, the D0 terminal is selected. The output of multiplexer 74 is coupled to summer 81.

The 11 bits from register 70 are divided by 32 by divider 72 before being coupled to the D1 terminal of multiplexer 74. The 18 bits from register 85 are divided by 128 by divider 77 and multiplied by −1 by multiplier 78 before being coupled to the D0 terminal of multiplexer 74. When the average value is found to be low compared to the instantaneous value (HISMPL=1), 1/32 of the instantaneous value is added to the contents of register 85 through summer 81 and multiplexer 84 (except when the D1 terminal of multiplexer 84 is selected as will be discussed later). If the average value is higher, the average value is divided by 128 and subtracted from the contents of register 85 within summer 81, and the new lower value is returned to register 85 through multiplexer 84.

Note that the average level is allowed to rise at a rate of 1/32 of the instantaneous value for each cycle of the 175 kHz clock, thus providing a linear rise of the average level for a constant input signal. In contrast, the decay of the average level is 1/128 of the actual average level for each cycle of the 175 kHz clock, which provides an exponential decay. The exponential decay is slower than the permissible linear rise of the average level. The linear rise rate is high enough to prevent blanking of the digital samples at the beginning of weak packets yet not too high to build up the average noise level on noise bursts. The slower decay was selected considering the following competing factors: A fast decay is helpful when a packet with a low average signal level is received following a packet with a high signal level, since snubbing will then be effective for the lower level packet. However, too fast a decay will cause snubbing of tones that do not substantially affect data recovery and cause unnecessary blanking of data. The decay rate of 1/128 is a good choice considering these opposing factors.

When a blanking event occurs, the blanking circuit 27 blanks the signal on lines 90 and 91. When this occurs the average signal level within register 85 is maintained constant (frozen). In effect, the noise pulse that caused the blanking is snubbed from the average, preventing it from building up the average. The duration of this freezing of the average will be discussed later. The freezing of the value in register 85 is controlled by the FREEZEAVG signal on line 87 which switches the multiplexer 84 (through OR gate 88) from selecting the D0 terminal to selecting the D1 terminal. When the D1 terminal is selected, the contents of register 85 are simply returned to register 85 through the D1 terminal of multiplexer 84. This freezing also occurs when either the AGC changes from low-to-high or high-to-low (AGCCHG signal asserted), or when the transceiver itself is transmitting (TCDOFF signal asserted). If the value of SNAVG in register 85 were not frozen when the transceiver was transmitting, then the transceiver would detect its own transmission at full strength causing the SNAVG value to rise toward full scale. Thus, under this condition SNAVG is frozen in order to maintain an accurate measure of externally-generated signals. The purpose of the extra clock delay introduced by register 70 at the output of multiplexer 69 will now be explained. Decimators 22 and 23 accomplish sample rate reduction by each summing 57 consecutive 10 MHz input samples to create a single higher-resolution output sample. If energy from an incoming noise pulse happens to span the boundary between two of the decimators' output samples, it is possible that there could be enough pulse energy in the first sample to disturb SNAVG—yet not enough energy to activate the FREEZEAVG condition. Thus, it is desirable to exclude this sample from affecting SNAVG. The extra cycle delay allows SNGT to activate FREEZEAVG in time to exclude this first disturbed sample.

BLANKER WITH SOFT TURN-ON

Figure 4:
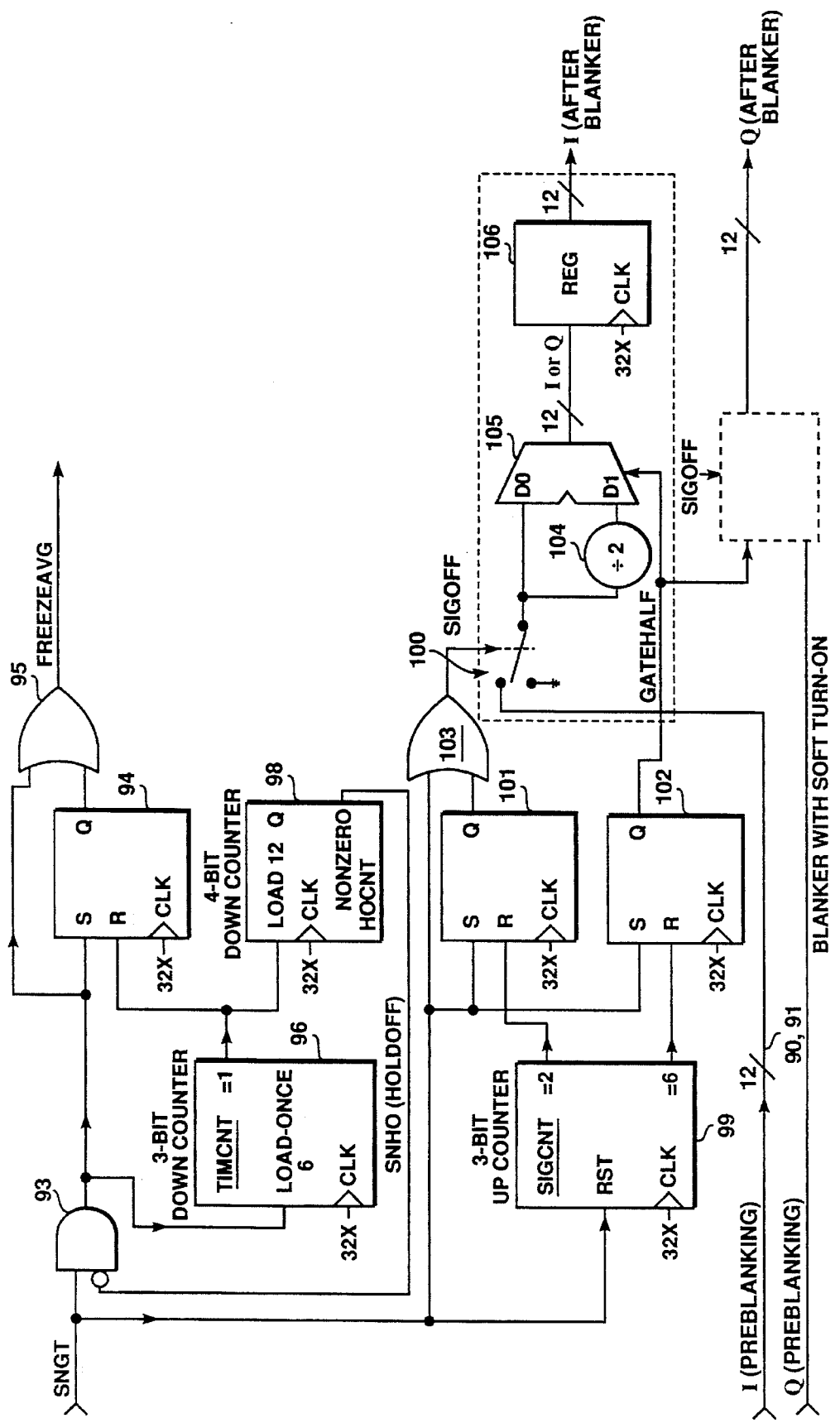
FIG. 4 is a detailed block diagram of the blanking with soft turn-on circuit of FIG. 1.

The blanking circuit 27 of FIG. 1 along with its soft turn-on circuit is shown in detail in FIG. 4. The circuit receives the "snubbing greater-than" signal (SNGT) from the comparator 63 of FIG. 3. This signal is coupled to one terminal of AND gate 93, the set terminals of flip-flops 101 and 102, OR gate 103 and reset terminal of the counter 99. Additionally, after this signal is passed through gate 93, it is coupled to the load-once terminal of counter 96, OR gate 95 and the set terminal of flip-flop 94.

The counter 96 is a 3-bit down counter (TIMCNT) which determines the duration of the FREEZEAVG signal previously discussed in conjunction with multiplexer 84 of FIG. 3. After the counter is loaded with a count of 6, it begins counting down at the 175 kHz rate (32× clock). Once this counter is loaded, it cannot be reloaded until it completes counting down to one. (This is not true for the other counter of FIG. 4.) When the counter reaches the count of one it asserts a signal to the reset terminal of the flip-flop 94 and to the load terminal of the counter 98. Ignoring for a moment gate 93, when the SNGT signal is received, it immediately causes FREEZEAVG to go high because of OR gate 95. Then after the next rising edge of the 32× clock is applied to flip-flop 94, the Q terminal of flip-flop 94 goes high maintaining FREEZEAVG high even though, at that time, SNGT may be low. FREEZEAVG remains high for the next six clock cycles of the 32× clock, that is, until the 3-bit down counter 96 has reached a count of 1, causing the flip-flop 94 to be reset. Thus FREEZEAVG is high for a total of 7 cycles of the 32× clocks.

The 4-bit down counter 98 is loaded at the same time the flip-flop 94 is reset (i.e., when FREEZEAVG goes low). The counter 98 starts at a count of 12 and then counts down to zero. Any time the count in counter 98 is not zero, a high signal is applied to the inverting terminal of AND gate 93 thereby forcing the output of gate 93 low. Otherwise, gate 93 passes the SNGT signal. Counter 98 controls the hold-off count time (HOCNT), which is used to prevent the FREEZEAVG from being reactivated for 12 cycles of the 32× clock following the seven clock cycles associated with counter 96. While counter 98 decrements from 12, the hold-off signal is active for 12 clock cycles of the 32× clock. As will be discussed and shown in more detail in FIG. 9, the hold-off signal is used to ensure that the snub average signal level is not continually frozen, that is, prevented from tracking a rise in the signal level. In effect, the hold-off signal prevents a latch-up which could otherwise occur with a step increase in received energy.

The lower portion of FIG. 4 illustrates the blanker itself. The detail of only one of the two channels is illustrated in FIG. 4. There are two switches 100, dividers 104, multiplexers 105 and registers 106: one for the I channel and one for the Q channel. Both switches 100 are controlled by the output of the OR gate 103 and both multiplexers are controlled by the output of flip-flop 102. In the discussion which follows, only one channel is discussed since both channels are constructed and operated in the same manner insofar as FIG. 4 is concerned.

The 3-bit up counter 99 controls the periods of both the blanking in the main signal paths (I and Q channels) and the soft turn-on of the main signals in these channels at the end of the blanking period. When SNGT goes high, the counter 99 is set to zero and thereafter it begins counting at the rate of the 32× clock. When it reaches a count of 2, it asserts an output signal which resets flip-flop 101. When it reaches a count of 6, it asserts an output signal which resets flip-flop 102.

An SNGT signal immediately causes the output of switch 100 to be grounded since this signal is immediately coupled to switch 100 through the OR gate 103. The SNGT signal also sets flip-flop 101, causing its Q terminal to go high, thereby maintaining switch 100 in the grounded position until the flip-flop 101 is reset. The time at which flip-flop 1 01 is reset is determined by counter 99. The total period that switch 100 remains grounded (if SNGT is high for only one cycle of the 32× clock) is four cycles of the 32× clock, the first cycle being controlled by the signal SNGT and the following three cycles being controlled by counter 99 before flip-flop 101 is reset. Thus, the blanking period includes three samples past the last sample which initiated the blanking event. This is done to ensure blanking of decaying tails of noise pulses, The signal in the I and Q channels is abruptly interrupted by switch 100 when the switch is grounded. However, when the switch reselects the channel, the signal is gradually reapplied (softly turned-on) since this reduces noise in the system. In the currently preferred embodiment, once switch 100 reselects after a blanking event, the GATEHALF signal from the flip-flop 102 causes multiplexer 105 to select the D1 terminal of this multiplexer. The D1 terminal receives one-half the signal level in its respective channel since the main signal is divided by two (by divider 104). The duration of the GATEHALF signal is determined by counter 99 and flip-flop 102. When the counter 99 is reset, flip-flop 102 is set, causing the GATEHALF signal to select terminal D1 of multiplexer 105. When the count in counter 99 reaches 6, flip-flop 102 is reset and the GATEHALF signal goes low causing multiplexer 105 to select the terminal D0 (full signal). Assuming there is no resetting of the counter 99 by an additional SNGT signal, the GATEHALF signal remains high for four cycles of the 32× clock after switch 100 reselects the channel; that is, the time period of counter 99 counting from a count of 2 to a count of 6. Thus, the halving period extends four samples beyond the blanking period (assuming SNGT remains low). This is done to reduce transient energy which would be generated if a large received signal was abruptly reinstated.

The output of the multiplexer 105 in each of the channels is passed through a register, shown as register 106, for storing the signal for one clock cycle of the 32× clock. This eases timing requirements in the circuitry which receives the output from the register.

Figure 9:
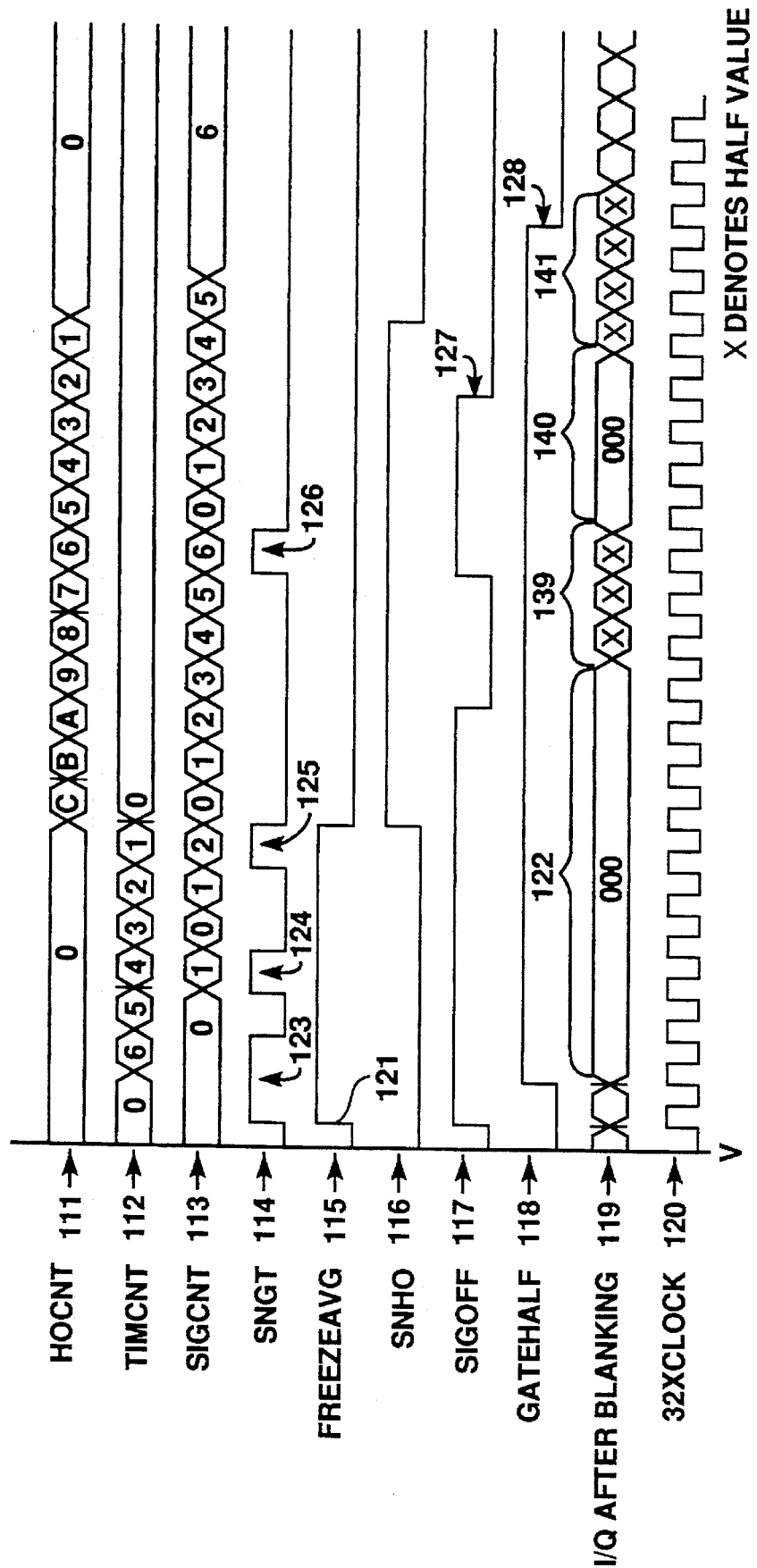

The operation of the circuits of FIGS. 3 and 4 can be better understood from the waveforms shown in FIG. 9. FIG. 9 illustrates a retriggerable blanking event; that is, the SNGT signal reoccurs before one or more of the counters in FIG. 4 have timed out. Waveform 111 of FIG. 9 (HOCNT) illustrates the count within counter 98 of FIG. 4. Waveform 112 (TIMCNT) is the count within counter 96 of FIG. 4. The count within counter 99 (SIGCNT) is illustrated by waveform 113 of FIG. 9. The snub greater-than signal (SNGT), which is the primary triggering signal for the circuit of FIG. 4, is shown by waveform 114 in FIG. 9. FREEZEAVG is represented by the waveform 11 5 in FIG. 9. The output NONZERO from counter 98, which is the hold-off signal (SNHO), is shown by waveform 116 in FIG. 9. The signal controlling switch 100 (SIGOFF) is shown by waveform 117 in FIG. 9. The GATEHALF signal which controls the soft turn-on in the main signal paths is shown as waveform 118 in FIG. 9. The signals in the I or Q channel after blanking are shown by waveform 119. Lastly, the 32× clock is represented by square wave 120.

Assume first that an anomaly in the waveform is detected (e.g., noise) as indicated by pulse 123 of waveform 114. This immediately causes waveform 115 to go high (edge 121) because of the OR gate 95 of FIG. 4. Switch 100 is immediately grounded under control of waveform 117 SIGOFF, and the GATEHALF signal 118 goes high on the occurrence of the next rising edge of the 32× clock. The I and Q signals are blanked in the main data paths and coupled to register 106. These blanked signals appear at the output of register 106 on the next rising edge of the 32× clock and remain blanked for the period 122 as will be discussed.

When the signal SNGT is active, counter 99 is reset. Since pulse 123 lasts for two cycles of the 32× clock, counter 99 (SIGCNT) is reset during two cycles and thus does not immediately begin counting. This is shown by the waveform 113 in FIG. 9. In addition, counter 99 is reset again during pulses 124 and 125. In contrast, counter 96 (TIMCNT) is loaded by the pulse 123 and begins decrementing from 6 and is not reloaded when pulse 124 occurs. At this point in time, the hold-off count in counter 98 remains zero as shown by waveform 111.

For the retriggerable blanking events shown in FIG. 9, another noise pulse occurs before counter 99 (SIGCNT) has reached a count of 2. Specifically, the pulse 124 causes counter 99 to again be reset to 0 as shown by the waveform 113. Another noise pulse 125 occurs as shown by waveform 114 which again resets counter 99 as shown by waveform 113. Thus, at this point in time, SIGOFF remains high preventing passage of the digital signal sequences in the I and Q channels.

When TIMCNT reaches a count of one, the counter 98 is loaded with a count of 12 (shown as C for waveform 111 ) and begins decrementing. During this count-down period, even though an SNGT pulse 126 occurs, FREEZEAVG remains low and the average signal level (SNAVG) is allowed to rise since the output NONZERO of counter 98 (HOCNT)is high as shown by waveform 116.

Before pulse 126 occurred, SIGCNT reached the count of 2, which resets SIGOFF, thus allowing switch 100 to reselect the channel. However, as the SNGT pulse 126 occurs, SIGOFF again goes high, and the count in counter 99 (SIGCNT) is reset and begins to count up. When SIGCNT again reaches a count of 2, SIGOFF goes low as shown by the edge 127. GATEHALF remains high indicating that only half the signal in the I and Q channels is passed until SIGCNT reaches a count of 6, which causes GATEHALF to be reset. This is shown by the trailing edge 128 in the GATEHALF signal, waveform 118.

It should be noted that during period 139, one-half of the I and Q channel values are passed (a soft turn-on); then during period 140 the switch 100 is grounded and no signal is passed in the I and Q channels. During period 141, one half the signal level in the I and Q channels is again passed and thereafter the full signal level is passed.

AGC CIRCUIT

The AGC circuit controls the gain of amplifier 14 of FIG. 1 such that the gain is either at unity or 18dB (or in transition between these gains). The appropriate gain is selected in response to the level of signals on the power line (as well as other derivative signals within the receiver). The SNAVG signal previously discussed is used for determining the average signal level on the line. The initiation and timing of gain changes are controlled so as to reduce data recovery errors, as will be described with reference to the examples of FIG. 8.

Figure 8:
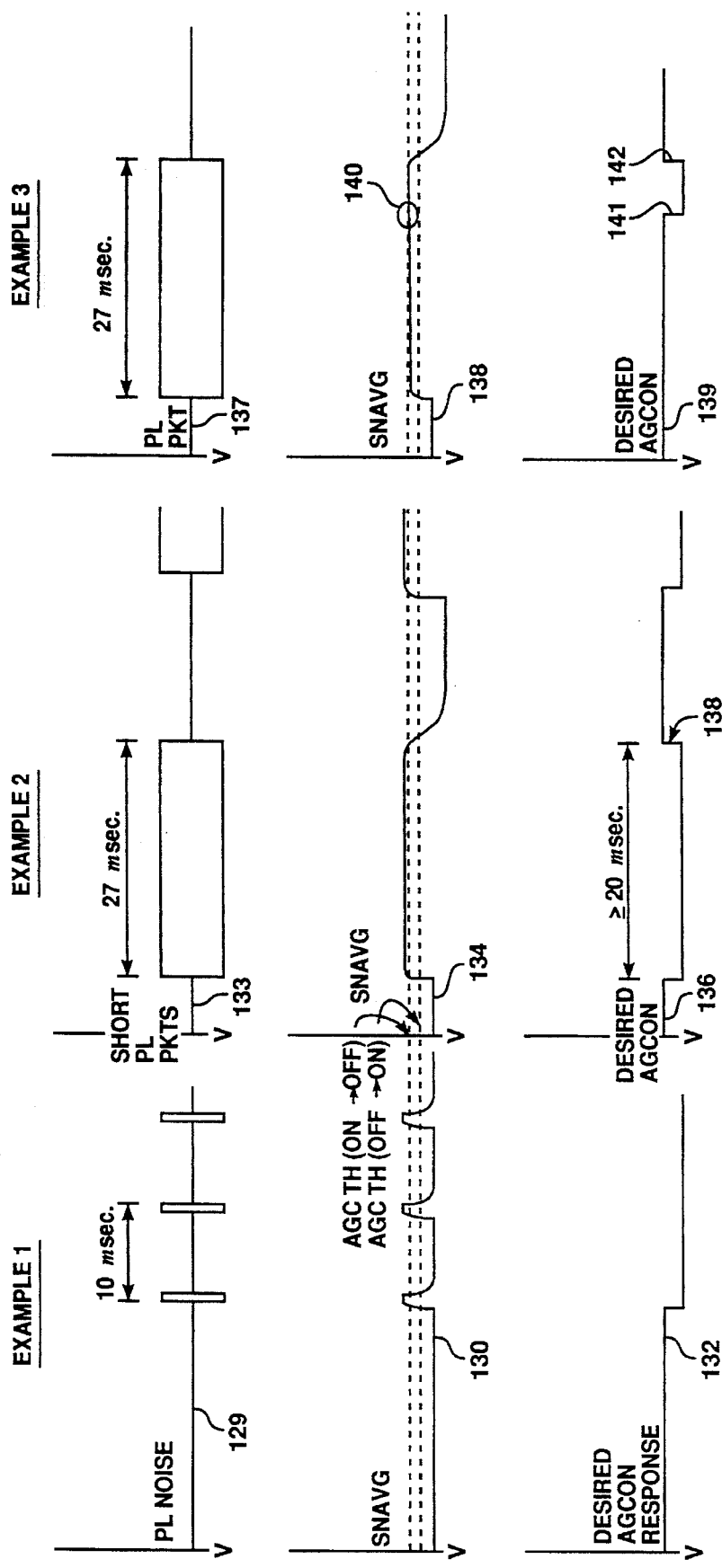
FIG. 8 illustrates waveforms used to describe the operation of the AGC circuit.

Referring to the first example of FIG. 8, noise pulses are shown on line 129 occurring with a 10 msec periodicity (e.g., noise that might typically be present on a 50 Hz power line due to conducted interference from a switch-mode power supply connected to the line ). The corresponding SNAVG signal is shown as line 130 of FIG. 8. Superimposed onto line 130 are dotted lines indicating two thresholds, the AGC on-to-off and off-to-on thresholds. The desired AGC response is shown on line 132. Note that the desired response shows the AGC transitioning to its low-gain state as soon as the SNAVG signal exceeds the AGC on-to-off threshold (in order to avoid clipping of data signals which may be riding on top of the noise bursts). Note also that the AGC gain is not switched in response to each periodic noise burst (thus reducing unnecessary gain change transients). The desired AGC response therefore would revert back to high-gain mode only after the SNAVG has remained below the AGC off-to-on threshold long enough to insure that the source of the periodic noise is no longer present.

Referring to the second example of FIG. 8, a received data packet is shown on line 133. The associated SNAVG response is drawn as line 134, which shows that the signal level of the illustrated packet exceeds the AGC on-to-off threshold. The desired AGC response is indicated by line 136 which shows the AGC gain transitioning to its low-gain state in response to this relatively large amplitude signal (to avoid clipping the received packet along with any added noise). Note that the desired AGC response also shows a transition back to high-gain mode right after reception of this large amplitude packet is complete. This is desirable so that the receiver is able to "hear" a low-amplitude packet which follows soon after the one of larger amplitude.

For the first example of FIG. 8, note that the desired AGC response calls for a delay before transitioning to high-gain state, while the second example requires rapid switching to the high-gain state (after SNAVG falls below the AGC off-to-on threshold). The present invention reduces data recovery errors caused by either switching gain at undesirable times or not switching gain at the illustrated desired times.

The third example of FIG. 8 illustrates another case where the AGC switching of the present invention is controlled in the desired manner to avoid data recovery errors. In this case, a packet is received which is very close to the AGC on-to-off threshold such that the AGC gain remains high for reception of most of the packet. The received data packet is shown on line 137, while the associated SNAVG and desired AGO response are shown by lines 138 and 139, respectively. In this example, the signal does eventually exceed the AGC on-to-off threshold at 140 (invoking the AGC's low-gain mode while data recovery is in progress). The preferred embodiment of the present invention reduces the probability that a data recovery error occurs due to transients induced by gain switching by ramping the gain change over several bit times. Note also that this third example of AGO operation illustrates a case where the AGC has transitioned to its low-gain state 141 late in a packet and yet it is still desirable that the AGC returns to its high-gain state 142 quickly after the end of the packet (for the same reason discussed above).

Figure 6:
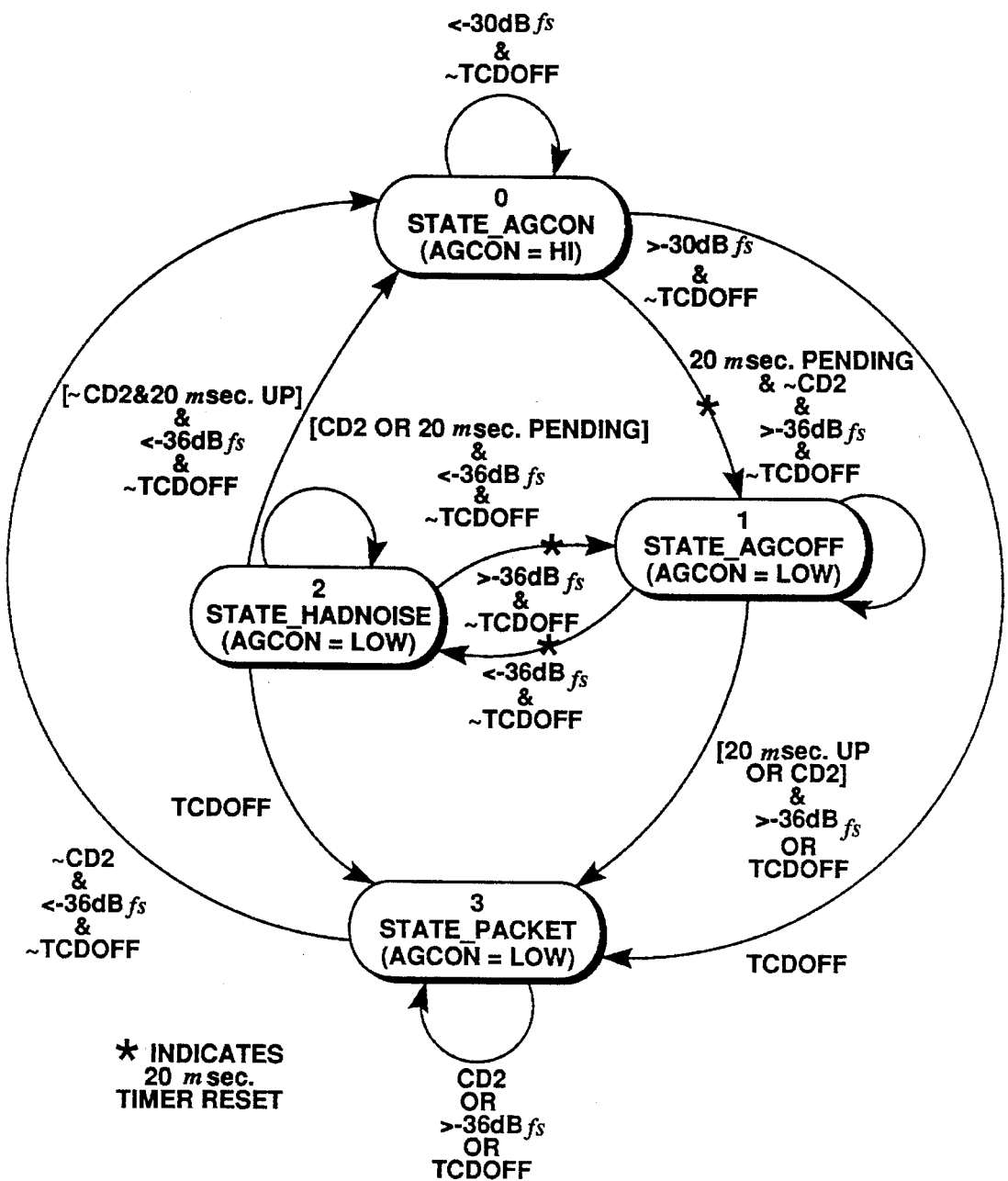
FIG. 6 is a state diagram illustrating the logic states of the AGC control logic of FIG. 5.

The preferred embodiment of the present invention which controls AGO gain in a desirable manner in order to minimize AGO-induced errors will now be described with reference to FIGS. 5 and 6.

First, referring to FIG. 5, the inputs to the AGC circuit are the signals SNAVG, TCDOFF, and CD2 and two clocks (a clock at 32 times the data bit rate denoted 32×; and clock 143 with a period of one millisecond). The CD2 signal is an indication that the presence of carrier has been detected and confirmed.

The outputs of the AGC circuit are the AGCON signal and the AGCCHG signal. When the AGCON signal is high, the AGC provides 18 dB gain (high-gain mode). When the AGCON signal is low, the AGC provides unity gain (low-gain mode).

In the preferred embodiment of the present invention, the ABC on-to-off threshold is defined as −30 dB relative to full scale (−30 dBfs), and the AGC off-to-on threshold is defined as −36 dB relative to full scale (−36 dBfs). Simple decoding of the binary representation of SNAVG is used to determine whether SNAVG exceeds either threshold. When one or more of bits 18, 17, 16, 15, 14 or 13 of SNAVG is high, SNAVG is considered to exceed −30 dBfs. When one or more of bits 18, 17, 16, 15, 14, 13 or 12 of SNAVG is high, SNAVG is considered to exceed −36 dBfs.

In FIG. 5, bits 13 through 18 of SNAVG are coupled to an OR gate 147 and the output of this OR gate indicates whether SNAVG is greater than −30 dBs (">−30 dBfs"). Bit 12 of SNAVG and the output of OR gate 147 are coupled to an OR gate 146, the output of which is an indication of whether SNAVG is above −36 dB (">−36 dBfs"). Both the >−30 dBfs indicator and the >−36 dBfs indicator are coupled to a state machine 145; the state diagram of state machine 145 is shown in FIG. 6. State machine 145 utilizes a 20-millisecond timer which is implemented in the form of a 5-bit counter 148. This counter is clocked by clocking signal 143 to provide a 20 msec timing interval for the AGC state machine.

The differentiator 144 simply differentiates the AGCON signal and consequently generates a pulse (AGCCHG) anytime the AGCON signal goes from high to low or from low to high.

The AGC state machine 145 implements the previously described desired switching mechanisms for controlling the AGC gain.

The AGCON signal is controlled by the AGC state machine. When the state machine (FIG. 6)is in state 0, the AGCON signal is high (high-gain mode). When the state machine is in any other state (i.e., states 1,2 or 3), the AGCONsignal is low (low-gain mode).

When the received signal consists of only low-level noise and/or low-level received packets (thus SNAVG is at a low value), the AGC state machine remains in state 0 (STATE_AGCON), where the AGCON signal is high so that the AGC provides 18 dB of gain.

Referring to the first example of FIG. 8, noise pulses are shown on line 129 occurring with a 10msec periodicity. The value of SNAVG rises with the noise. When SNAVG exceeds the −30 dBfs threshold, the output of OR gate 147 in FIG. 5 goes high indicating ">−30 dBfs". As a result, according to the AGC state diagram of FIG. 6, the AGC state machine goes to state 1 (STATE_AGCOFF). Note that in this state the AGCON signal is low so that the AGC is providing unity gain. The 20msec timer is started at the same time as the state transition.

The state machine remains in state 1 as long as SNAVG remains above −36 dBfs (>−36 dBfs) and no carrier is detected (~CD2) and the 20 msec timer has not timed out (20 msec PENDING).

If SNAVG drops below −36 dBfs (which happens in Example 1 of FIG. 8 when the noise pulse ends) the state machine goes to state 2 (STATE_HADNOISE). At the same time the 20 msec timer is restarted. If SNAVG exceeds −36 dBfs again (which happens in example 1 at the time of the next noise pulse), the state machine returns to state 1 and the 20 msec timer is yet again restarted. There can be multiple transitions back and forth between states 1 and 2 as SNAVG exceeds and drops below −36 dBfs at intervals of less than 20 msec.

If the state machine is in state 2, and SNAVG has stayed below −36 dBfs for 20 msec (causing the 20 msec timer to time out), the state machine returns to state 0 and the AGCON signal goes high. This would happen, for example, when the periodic noise source of example 1 of FIG. 8 is no longer present.

Referring to the second example of FIG. 8, a received data packet is shown on line 133 causing SNAVG to rise above −30 dBfs. As a result, according to the state diagram of FIG. 6 the AGC state machine goes from state 0 to state 1. Soon thereafter, the carrier detect signal CD2 goes high, and the state machine leaves state 1 and reaches state 3 (STATE_PACKET). The state machine remains in state 3 as long as CD2 is high or SNAVG exceeds −36 dBfs.

State 3 (STATE_PACKET) allows the AGC state machine to differentiate between packets and periodic line noise bursts, and to respond to them in different ways. As mentioned previously, it is desired to have the AGC revert to high-gain mode right after reception of a large-amplitude packet. Accordingly, the state diagram of FIG. 6 specifies the state machine to go from state 3 to state 0 (i.e., AGCON goes high) when CD2 goes low at the end of the packet and SNAVG goes below −36 dBfs.

Referring to the third example of FIG. 8, the AGO remains in high-gain mode (i.e., state machine 145 remains in state 0) for reception of most of an intermediate-amplitude packet. When the SNAVG signal does eventually exceed −30 dBfs, the state machine goes from state 0 to state 1 and AGCON goes low. At that point, since the carrier detect indicator CD2 is high, the state machine immediately goes on to state 3 where it remains until the end of the packet. Then it returns to state 0 when CD2 goes low and SNAVG falls below −36 dBfs. The path through the state machine in this case is similar to that discussed for the second example of FIG. 8.

A gain change from high gain to low gain during reception of a packet of high amplitude is necessary to prevent overloading of the receiver which could cause multiple data recovery errors. To minimize errors due to gain-switching transients during packet reception, only one gain transition from high gain to low gain is allowed per packet. Switching in the other direction from low gain to high gain is not allowed during reception of a packet. The state diagram of FIG. 6 enforces this rule because the only way to leave state 3 (AGCON low) and return to state 0 (AGCON high) is for CD2 to go low, which happens only at the end of a packet.

Consider also the following case: a noise burst occurs which causes the state machine 145 to enter state 2 as previously discussed, and a packet is subsequently detected causing CD2 to go high. In this case the state machine also prohibits switching from low gain to high gain during packet reception by prohibiting a transition from state 2 to state 0 until CD2 goes low (~CD2).

It is also desired to revert to high-gain mode immediately at the end of a packet that is transmitted by another type of communication device sharing the same medium. The presence of such a packet is implied when the state machine is in state 1 and the 20 msec timer times out without CD2 going high. The state machine enters state 3, where it remains until SNAVG falls below −36 dBfs (i.e., when the packet ends).

Finally, the AGC switches to low-gain mode while the transceiver is transmitting in order to desensitize the receiver circuitry to the transceiver's own transmitted carrier. This is achieved by means of coupling the TCDOFF signal (which indicates that the transceiver is transmitting) to the AGC state machine 145. As shown in the state diagram of FIG. 6, when TCDOFF goes high, the state machine immediately enters state 3 no matter what state it is currently in, thus ensuring that AGCON goes low. The state machine exits state 3 and enters state 0 only when TCDOFF goes low. At this point the AGC reverts to high-gain mode thus immediately enabling the receiver to detect low-level packets.

Thus, improved snubbing in a PLC apparatus has been described which operates in conjunction with AGC logic.

We claim:

1. In a circuit where an information carrying signal is examined for noise pulses and the information carrying signal is blanked during the noise pulses to reduce interference between the noise pulses and the information, an improved method for operation of the circuit comprising the steps of:

converting the information carrying signal to first digital signals;

determining a second digital signal representative of an average of the first digital signal;

multiplying the second digital signal by a predetermined number to provide a third digital signal;

comparing the third digital signal to the first digital signals; and blanking the first digital signals during the occurrence of at least some of the noise pulses.

2. The method defined by claim 1 including the steps of:

turning on the first digital signals following the blanking by increasing amplitudes represented by the first digital signals more slowly than the first digital signals were turned off for the blanking.

3. The method defined by claim 1 wherein the determining of the second digital signal step includes the freezing of the second digital signal when the blanking occurs.

4. The method defined by claim 3 wherein the freezing of the second digital signal is prevented when a second blanking occurs within a predetermined period following a first blanking.

5. In a circuit where an information carrying signal is examined for noise pulses and the information carrying signal is blanked during the noise pulses to reduce interference between the noise pulses and the information, an improved method for operating the circuit comprising the steps of:

establishing a threshold signal level as a function of the signal level of the information carrying signal;

generating a blanking control signal for controlling the blanking when the signal level of the information carrying signal exceeds the threshold signal level;

blanking the information carrying signal under control of the blanking control signal; and, excluding the information carrying signal level from the establishing of the threshold signal level when the information carrying signal is blanked.

6. The method defined by claim 5 wherein the excluding step is omitted when a second blanking occurs with a predetermined period following a first blanking.

7. The method defined by claim 5 where the blanking step comprises:

turning-off the information carrying signal and then gradually turning-on the information carrying signal, the gradual turning-on being gradual when compared to the turning-off of the information carrying signal.

8. In a communications apparatus for communicating packets of information over a power line where the information is carried by a carrier signal having a frequency substantially higher than the fundamental frequency of the power, an improvement comprising:

analog-to-digital converter for providing digital signals representative of a band of signals on the power line that includes the carrier signal;

a first circuit for determining a DC offset for the digital signals, coupled to the converter;

a subtractor for subtracting the DC offset from the digital signals, coupled to the first circuit;

a second circuit for determining an average signal level for the digital signals, coupled to the subtractor;

a comparator for comparing the digital signals to the average signal level, coupled to the second circuit and the substractor, the comparator providing a control signal; and, a blanker for blanking the digital signals under control of the control signal, coupled to the comparator and coupled to receive the digital signals.

9. The improvement defined by claim 8 wherein the second circuit permits the average signal level to rise more quickly than it decays.

10. The improvement defined by claim 8 wherein the blanker provides a freeze signal to the second circuit for freezing the average signal level for a first period of time when the digital signals are blanked.

11. The improvement defined by claim 10 wherein the first period of time is a first predetermined period of time and wherein the average signal level is prevented from being frozen for a second predetermined period of time following the first predetermined period of time.

12. The improvement defined by claim 11 wherein the blanker gradually reinstates the digital signals over a third period of time following the blanking of the digital signals.

13. The improvement defined by claim 12 wherein the blanking is extended beyond the control signal by fourth period of time.

14. In a communications apparatus where information is encoded on an encoded signal and where a signal representative of the instantaneous amplitudes of the encoded signal is compared with a signal representative of an average amplitude of the encoded signal to enable detection of noise spikes, and additionally where the encoded signal is blanked upon detection of the noise spikes, an improvement comprising:

a circuit for preventing at least some of the noise spikes from changing the signal representative of the average amplitude of the encoded signal, the circuit being coupled in the apparatus for controlling the signal representative of the average amplitude.

15. In a communications apparatus for communicating packets of information over a power line where the information is carried by a carrier signal having a frequency substantially higher than the fundamental frequency of the power, an improved method comprising the steps of:

detecting anomalies in the carrier signal by comparing a signal representative of the instantaneous carrier signal level with a signal representative of an average carrier signal level;

blanking the carrier signal at least during the occurrence of the anomalies; and, preventing the signal representative of the average carrier signal level from being changed by the anomalies in the carrier signal.

16. The method defined by claim 15 wherein the blanking step includes gradually turning on the carrier signal after the anomalies have passed.

17. In a communications apparatus for communicating packets of information on a power line where the information is carried by a carder signal having a frequency substantially higher than the frequency of the power, an improvement comprising:

analog-to-digital converter for providing digital signals representative of a frequency band from the power line that includes the carrier signal;

a high pass filter for removing low frequency components from the digital signals;

a first circuit for determining an average signal level for the digital signals, the first circuit permitting the average signal level to rise more quickly than it decays, the first circuit coupled to the filter;

a comparator for comparing the digital signals to the average signal level and for providing a control signal when the digital signals exceed the average signal by a predetermined amount, the comparator being coupled to the first circuit; and a blanker for blanking the digital signals under control of the control signal, coupled to the comparator and coupled to receive the digital signals.

18. The improvement defined by claim 17 wherein the blanker provides a freeze signal to the first circuit for freezing the average signal level for a first predetermined period of time when the digital signals are blanked and wherein the average signal level is prevented from being frozen for a second predetermined period of time following the first predetermined period of time.

19. The improvement defined by claim 18 wherein the blanker gradually reinstates the digital signal over a third period of time following the blanking of the digital signal.

20. The improvement defined by claim 17 wherein the blanking extends beyond where the control signal indicates that the digital signals do not exceed the average signal by the predetermined amount.

\* \* \* \* \*

UNITED STATES PATENT AND TRADEMARK OFFICE
CERTIFICATE OF CORRECTION

PATENT NO.    : 5,463,662
DATED         : October 31, 1995
INVENTOR(S)   : Sutterlin et al.

It is certified that error appears in the above-identified patent and that said Letters Patent is hereby corrected as shown below:

In column 3 at line 40 delete "carder" and insert --carrier--

In column 11 at line 55 delete "AGO" and insert --AGC--

In column 11 at line 62 delete "AGO" and insert --AGC--

In column 12 at line 1 delete "AGO" and insert --AGC--

In column 12 at line 2 delete "AGO" and insert --AGC--

In column 13 at line 37 delete "AGO" and insert --AGC--

In column 16 at line 24 delete "carder" and insert --carrier--

Signed and Sealed this

Twenty-first Day of October 1997

Attest:

BRUCE LEHMAN

Attesting Officer

Commissioner of Patents and Trademarks